(12) United States Patent
Yang et al.

(10) Patent No.: US 10,868,566 B2
(45) Date of Patent: Dec. 15, 2020

(54) ERROR CORRECTION DEVICE, OPERATING METHOD OF ERROR CORRECTION DEVICE, AND CONTROLLER INCLUDING ERROR CORRECTION DEVICE

(71) Applicant: SAMSUNG ELECTRONICS CO., LTD., Suwon-si (KR)

(72) Inventors: Kyeongcheol Yang, Pohang-si (KR); Sunghye Cho, Pohang-si (KR); Youngjun Hwang, Hwaseong-si (KR); Junjin Kong, Yongin-si (KR); Hong Rak Son, Anyang-si (KR); Dong-Min Shin, Seoul (KR); Kijun Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 46 days.

(21) Appl. No.: 16/100,979

(22) Filed: Aug. 10, 2018

(65) Prior Publication Data

US 2019/0190539 A1  Jun. 20, 2019

(30) Foreign Application Priority Data

Dec. 14, 2017  (KR) .................... 10-2017-0172571

(51) Int. Cl.
| G06F 11/00 | (2006.01) |
| G06F 11/30 | (2006.01) |
| G08C 25/00 | (2006.01) |
| H03M 13/00 | (2006.01) |
| H04L 1/00 | (2006.01) |

(Continued)

(52) U.S. Cl.
CPC ...... *H03M 13/112* (2013.01); *H03M 13/1117* (2013.01); *H03M 13/1125* (2013.01); *H03M 13/3715* (2013.01); *H03M 13/3746* (2013.01); *H03M 13/6577* (2013.01)

(58) Field of Classification Search
CPC .......... H03M 13/112; H03M 13/3746; H03M 13/1125; H03M 13/6577; H03M 13/1117; H03M 13/3715
See application file for complete search history.

(56) References Cited

U.S. PATENT DOCUMENTS

| 8,429,483 B1 * | 4/2013 | Varnica ............... G06F 11/1048 714/752 |
| 8,458,556 B2 | 6/2013 | Planjery et al. |
| 8,683,303 B2 | 3/2014 | Blanksby |

(Continued)

OTHER PUBLICATIONS

Shiva Kumar Planjery et al., "Finite Alphabet Iterative Decoders-Part I: Decoding Beyond Belief Propagation on the Binary Symmetric Channel," IEEE Transactions on Communications, vol. 61, No. 10, Oct. 2013, pp. 4033-4045.

(Continued)

*Primary Examiner* — Samir W Rizk
(74) *Attorney, Agent, or Firm* — Volentine, Whitt & Francos, PLLC

(57) ABSTRACT

An error correction device includes a low density parity check (LDPC) decoder and an adaptive decoding controller. The LDPC decoder iteratively performs LDPC decoding on data by using a decoding parameter. The adaptive decoding controller calculates an error rate depending on a result of the LDPC decoding and adjusts the decoding parameter depending on the error rate.

18 Claims, 13 Drawing Sheets

(51) Int. Cl.
*H03M 13/11* (2006.01)
*H03M 13/37* (2006.01)

(56) References Cited

U.S. PATENT DOCUMENTS

| | | | |
|---|---|---|---|
| 8,930,788 B2 | 1/2015 | Zhang et al. | |
| 8,935,601 B1 | 1/2015 | Varnica et al. | |
| 9,450,610 B1 | 9/2016 | Micheloni et al. | |
| 9,667,273 B2 | 5/2017 | Kim et al. | |
| 2007/0118786 A1* | 5/2007 | Lim | H04L 1/08 |
| | | | 714/751 |
| 2009/0070659 A1 | 3/2009 | Zhong et al. | |
| 2012/0198301 A1 | 8/2012 | Blanksby | |
| 2014/0032996 A1* | 1/2014 | Maeto | H03M 13/13 |
| | | | 714/780 |
| 2014/0068368 A1 | 3/2014 | Zhang et al. | |
| 2015/0149873 A1* | 5/2015 | Cai | H03M 13/458 |
| | | | 714/773 |
| 2015/0207523 A1 | 7/2015 | Abu-Surra et al. | |
| 2015/0263763 A1 | 9/2015 | Kim et al. | |
| 2017/0093428 A1* | 3/2017 | Yen | H03M 13/1128 |
| 2017/0149446 A1* | 5/2017 | Tao | H03M 13/1117 |
| 2017/0279465 A1* | 9/2017 | Kumar | H03M 13/152 |

OTHER PUBLICATIONS

Vikram Arkalgud Chandrasetty et al., "FPGA Implementation of High Performance LDPC Decoder using Modified 2-bit Min-Sum Algorithm," Second International Conference on Computer Research and Development, pp. 382-385.

* cited by examiner

FIG. 6

|  | Lth | Cth | T1 | T2 |
|---|---|---|---|---|
| 1st Decoding Parameter(111) | 3 | 3 | 1 | 3 |
| 2nd Decoding Parameter(112) | 2 | 2 | 1 | 3 |
| 3rd Decoding Parameter(113) | 2 | 1 | 1 | 3 |

FIG. 10

|  | Lth | Cth | T1 | T2 | Ith |
|---|---|---|---|---|---|
| 1st Decoding Parameter(111) | 3 | 3 | 1 | 3 | 3 |
| 2nd Decoding Parameter(112) | 2 | 2 | 1 | 3 | 2 |
| 3rd Decoding Parameter(113) | 2 | 1 | 1 | 3 | 1 | ns # ERROR CORRECTION DEVICE, OPERATING METHOD OF ERROR CORRECTION DEVICE, AND CONTROLLER INCLUDING ERROR CORRECTION DEVICE

CROSS-REFERENCE TO RELATED APPLICATIONS

This application claims priority under 35 U.S.C. § 119 to Korean Patent Application No. 10-2017-0172571 filed on Dec. 14, 2017, in the Korean Intellectual Property Office, the disclosure of which is incorporated by reference herein in its entirety.

BACKGROUND

Embodiments of the disclosure relate to an electronic device, and more particularly, to an error correction device, an operating method of the error correction device, and a controller including the error correction device.

A semiconductor memory supports a write operation for storing data and a read operation for reading the stored data. An error may occur while data are being written in the semiconductor memory, while data are being stored in the semiconductor memory, or while data are being read from the semiconductor memory. Various error correction methods for correcting the error are being developed.

A low density parity check (LDPC) method is one of error correction methods that have been developed in recent years. In the LDPC method, a typical decoding method for error correction needs high computational complexity. To decrease the decoding complexity of the LDPC method, there are various attempts to approximate an LDPC decoder. However, the approximation of the LDPC decoder causes an increase in an error floor and makes the error correction capacity lower than the error correction capacity of a typical decoding method using the LDPC method.

SUMMARY

Embodiments of the disclosure provide an error correction device having a high error correction capacity and a low error floor, an operating method of the error correction device, and a controller including the error correction device.

According to an exemplary embodiment, an error correction device includes a low density parity check (LDPC) decoder that iteratively performs LDPC decoding on data by using a decoding parameter. An adaptive decoding controller calculates an error rate depending on a result of the LDPC decoding and adjusts the decoding parameter depending on the error rate.

According to an exemplary embodiment, an operating method of an error correction device includes receiving data, performing first low density parity check (LDPC) decoding on the data, based on a first decoding parameter, calculating an error rate depending on a result of the first LDPC decoding, adjusting the first decoding parameter to a second decoding parameter depending on the error rate, and performing second LDPC decoding on the data, based on the second decoding parameter.

According to an exemplary embodiment, a controller includes a memory interface that receives data from a memory. An error correction device corrects an error of the data received through the memory interface. The error correction device includes a low density parity check (LDPC) decoder that iteratively perform LDPC decoding on the data by using a decoding parameter. An adaptive decoding controller calculates an error rate depending on a result of the LDPC decoding and adjusts the decoding parameter depending on the error rate.

According to an exemplary embodiment, a storage device includes a semiconductor memory, an error correction decoder, and a controller. The semiconductor memory stores data. The error correction decoder receives the data from the semiconductor memory and applies low-density parity check (LDPC) decoding to the data using a value of a log likelihood ratio (LLR) parameter to generate a decoding result. The controller: (1) calculates an error rate within the decoding result, (2) generates a revised value of the LLR parameter based on the error rate, (3) controls the error correction decoder to apply the LDPC decoding to the data using the revised value of the LLR parameter to generate a revised decoding result that contains no errors, and (4) outputs the revised decoding result.

BRIEF DESCRIPTION OF THE FIGURES

The above and other objects and features of the disclosure will become apparent by describing in detail exemplary embodiments thereof with reference to the accompanying drawings.

FIG. 6 illustrates an example of decoding parameters mentioned in Table 1 to Table 3.

FIG. 10 illustrates an application of first to third decoding parameters of FIG. 6.

DETAILED DESCRIPTION

Below, embodiments of the disclosure may be described in detail and clearly to such an extent that an ordinary one in the art easily implements the disclosure.

Figure 1:
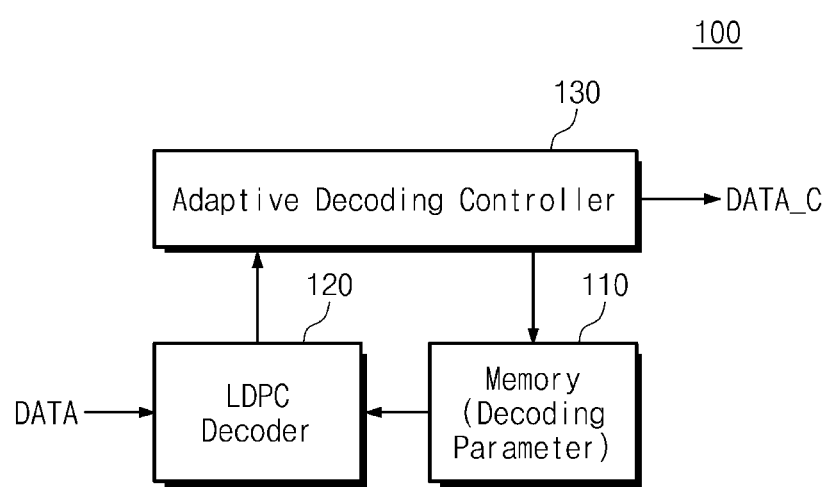
FIG. 1 is a block diagram illustrating an error correction device according to an embodiment of the disclosure.

FIG. 1 is a block diagram illustrating an error correction device 100 according to an embodiment of the disclosure. Referring to FIG. 1, the error correction device 100 includes a memory 110, a low density parity check (LDPC) decoder 120, and an adaptive decoding controller 130.

The memory 110 may store a decoding parameter necessary for the LDPC decoder 120 to perform error correction decoding (e.g., LDPC decoding). When the LDPC decoder 120 requests the decoding parameter, the memory 110 may provide the decoding parameter to the LDPC decoder 120.

The LDPC decoder 120 may receive data "DATA" from a first external device. The LDPC decoder 120 may receive the decoding parameter from the memory 110. The LDPC decoder 120 may perform error correction decoding (e.g., LDPC decoding) on the data "DATA", based on the decoding parameter.

For example, the LDPC decoder 120 may iteratively perform LDPC decoding including check node update and variable node update. The LDPC decoder 120 may transfer the LDPC decoding result to the adaptive decoding controller 130. For example, when LDPC decoding is iteratively performed, the LDPC decoder 120 may transfer each of the LDPC decoding results to the adaptive decoding controller 130.

The adaptive decoding controller 130 may receive the LDPC decoding result from the LDPC decoder 120. If the LDPC decoding result indicates that no error exists, the adaptive decoding controller 130 may output error-corrected data DATA_C to a second external device. If the LDPC decoding result indicates that an error exists, the adaptive decoding controller 130 may calculate (or compute) an error rate of the LDPC decoding result and may control the memory 110 based on the error rate.

For example, the adaptive decoding controller 130 may allow the memory 110 to output a different decoding parameter depending on the error rate. For example, the adaptive decoding controller 130 may transfer an address of a storage area, in which a decoding parameter that the memory 110 will transfer to the LDPC decoder 120 is stored, to the memory 110, and may change an address depending on the error rate.

Figure 2:
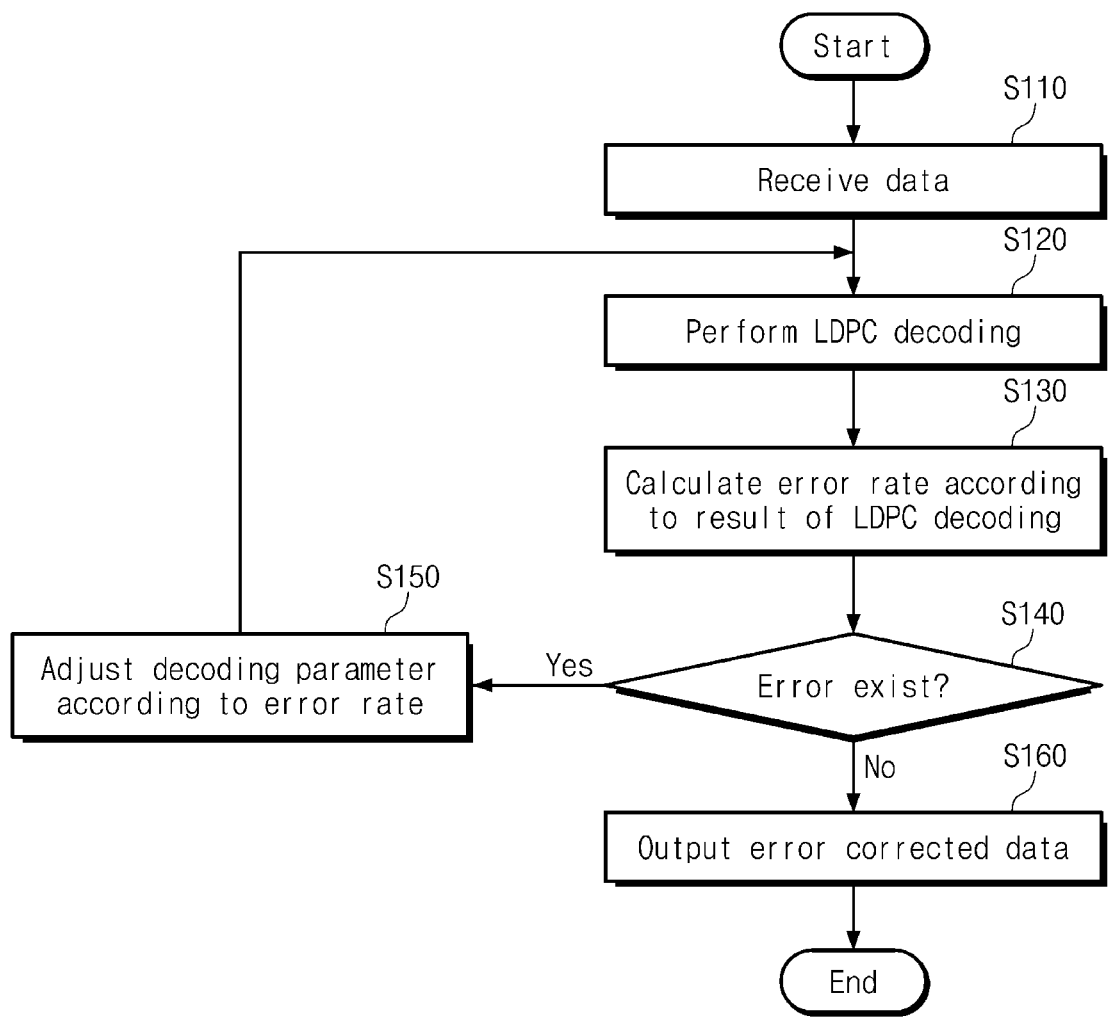
FIG. 2 is a flowchart illustrating an operating method of an error correction device according to an embodiment of the disclosure.

FIG. 2 is a flowchart illustrating an operating method of the error correction device 100 according to an embodiment of the disclosure. In an embodiment, an example is described in which the error correction device 100 corrects an error of bits corresponding to one error correction unit. Referring to FIGS. 1 and 2, in operation S110, the LDPC decoder 120 of the error correction device 100 may receive data "DATA" from the first external device.

The data "DATA" may have a length (e.g., the number of bits, the number of samples, or the number of symbols) corresponding to an error correction unit in which the error correction device 100 corrects an error once. In operation S120, the LDPC decoder 120 of the error correction device 100 may perform LDPC decoding on the received data "DATA".

For example, the LDPC decoder 120 may perform LDPC decoding based on the decoding parameter received from the memory 110. LDPC decoding may include check node update and variable node update. The LDPC decoder 120 may transfer the LDPC decoding result to the adaptive decoding controller 130. In operation S130, the adaptive decoding controller 130 of the error correction device 100 may calculate an error rate depending on the LDPC decoding result. For example, the adaptive decoding controller 130 may calculate an error rate of values of updated variable nodes.

If it is determined in operation S140 that an error exists, operation S150 is performed. In operation S150, the adaptive decoding controller 130 of the error correction device 100 may adjust the decoding parameter depending on the error rate. For example, the adaptive decoding controller 130 may allow the memory 110 to output a different decoding parameter depending on the error rate. Afterwards, the process proceeds to operation S120, in which LDPC decoding is again iterated. If it is determined in operation S140 that an error does not exist, the adaptive decoding controller 130 may output error-corrected data DATA_C to the second external device in operation S160.

To sum up, the error correction device 100 according to an embodiment of the disclosure may iteratively perform LDPC decoding and may adjust a decoding parameter for performing LDPC decoding (e.g., next LDPC decoding) depending on an error rate of each LDPC decoding result. A decoding parameter may be adjusted to further decrease an error floor of the error correction device 100. Accordingly, the error floor of the error correction device 100 decreases.

Figure 3:
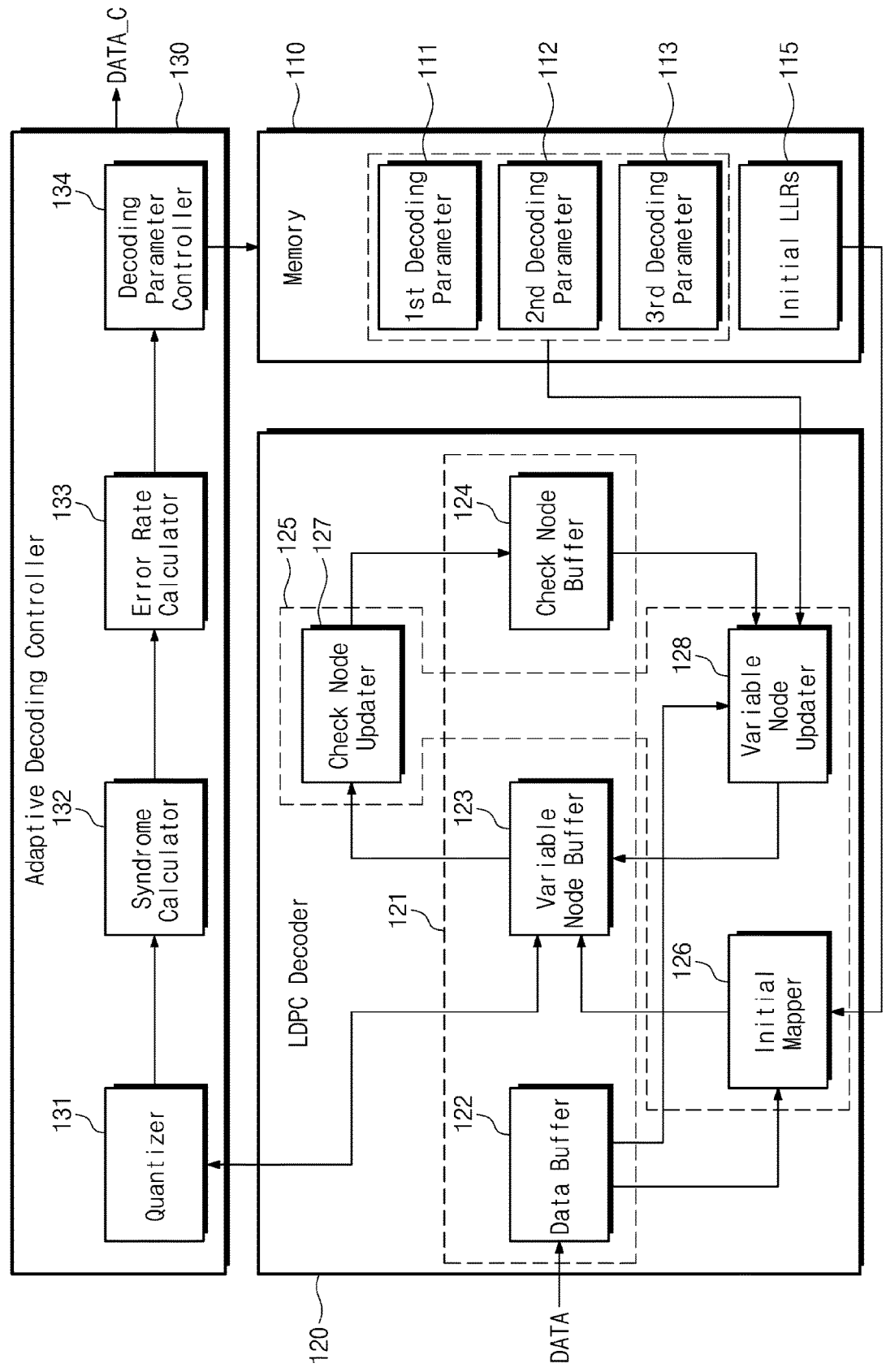
FIG. 3 shows an error correction device according to an embodiment of the disclosure.

FIG. 3 shows the error correction device 100 according to an embodiment of the disclosure. Referring to FIG. 3, the memory 110 may store first to third decoding parameters 111 to 113 and initial log likelihood ratio (LLR) values 115. Each of the first to third decoding parameters 111 to 113 may include information needed for the LDPC decoder 120 to perform LDPC decoding.

The memory 110 may provide one of the first to third decoding parameters 111 to 113 to the LDPC decoder 120 under control of the adaptive decoding controller 130 or in response to a request of the LDPC decoder 120. In an embodiment, an example is illustrated in FIG. 3 in which the first to third decoding parameters 111 to 113 are stored in the memory 110. However, the disclosure may not be limited thereto. Also, the number of decoding parameters stored in the memory 110 is not limited to the example of FIG. 3.

The initial LLR values 115 may include initial log likelihood ratios (LLRs) associated with (assigned to) respective bits of data "DATA". In response to a request of the LDPC decoder 120 or under control of the adaptive decoding controller 130, the memory 110 may transfer the initial LLR values to the LDPC decoder 120 when the LDPC decoder 120 initiates LDPC decoding.

The LDPC decoder 120 includes a storage block 121 and a computation block 125. The storage block 121 includes a data buffer 122, a variable node buffer 123, and a check node buffer 124. The data buffer 122 may store the data "DATA" from the first external device.

The variable node buffer 123 may store values of variable nodes of LDPC decoding. The check node buffer 124 may store values of check nodes of LDPC decoding. The computation block 125 includes an initial mapper 126, a check node updater 127, and a variable node updater 128.

The initial mapper 126 may receive the data "DATA" from the data buffer 122 and may receive the initial LLR values 115 from the memory 110. The initial mapper 126 may map the data "DATA" to the initial LLR values 115 and may store the mapping result in the variable node buffer 123. For example, the initial mapper 126 may map one initial LLR value of the initial LLR values 115 to each bit of the data "DATA", based on each bit of the data "DATA".

The check node updater 127 may update values of check nodes by using values of variable nodes stored in the variable node buffer 123. The check node updater 127 may store the updated values of the check nodes in the check node buffer 124.

The variable node updater 128 may update values of variable nodes by using the values of the check nodes stored in the check node buffer 124, a decoding parameter received from the memory 110, and the data "DATA" transferred from the data buffer 122. The variable node updater 128 may store the updated values of the variable nodes in the variable node buffer 123.

The adaptive decoding controller 130 includes a quantizer 131, a syndrome calculator 132, an error rate calculator 133, and a decoding parameter controller 134. The quantizer 131 may convert the values of the variable nodes stored in the variable node buffer 123 to digital values. For example, the quantizer 131 may convert a value of one variable node to one digital bit.

The syndrome calculator 132 may receive digital bits from the quantizer 131. The digital bits received from the quantizer 131 may be an intermediate result of the data "DATA", to which LDPC decoding performed up to now is applied. The syndrome calculator 132 may compute (e.g., perform a matrix product on) the digital bits and a parity check matrix to calculate syndromes (or a syndrome vector including syndromes).

For example, if values of the variable nodes associated with the digital bits are correct values, the syndrome calculation result may be "0". For example, if values of the variable nodes associated with the digital bits are incorrect values, the syndrome calculation result may be "1". The number of 1's calculated through syndrome calculation may be the number of incorrect values (e.g., errors) present in the digital bits (or the values of the variable nodes).

The syndrome calculator 132 may transfer the number of 1's calculated through syndrome calculation, that is, the number of errors present in the intermediate result of LDPC decoding to the error rate calculator 133. The error rate calculator 133 may calculate an error rate, based on the number of errors. For example, the error rate calculator 133 may calculate the number of errors to the number of variable nodes (e.g., the number of bits, symbols, or samples of the data "DATA") as the error rate.

For another example, the error rate calculator 133 may calculate the number of errors to the number of check nodes (e.g., the number of correctable bits, symbols, or samples) as the error rate. For another example, the error rate calculator 133 may calculate the error rate by normalizing the number of errors by using a particular constant or variable.

For another example, the error rate calculator 133 may calculate the number of errors as the error rate. That is, the error rate may be understood as being a ratio of the number of errors to its own self. For another example, the error rate calculator 133 may calculate a value obtained by normalizing (scaling) the number of errors to a particular value (or number) as the error rate.

In an embodiment, if a value of a particular check node is "0", values of variable nodes associated with the particular check node may not have an error. In an embodiment, if a value of a particular check node is "1", values of variable nodes associated with the particular check node may have an error. That is, the number of errors detected by the syndrome calculator 132 may be interpreted as being the number of check nodes having a value of "1".

In an embodiment, the error rate may be calculated as the number of check nodes having a value of "1" to the number of variable nodes. For another example, the error rate may be calculated as the number of check nodes having a value of "1" to the number of check nodes. For another example, the error rate calculator 132 may calculate the error rate by normalizing the number of check nodes having a value of "1" by using a particular constant or variable.

The error rate calculator 133 may transfer the calculated error rate to the decoding parameter controller 134. The decoding parameter controller 134 may control the memory 110, based on the error rate. For example, the decoding parameter controller 134 may allow the memory 110 to output a different decoding parameter depending on the error rate.

Figure 4:
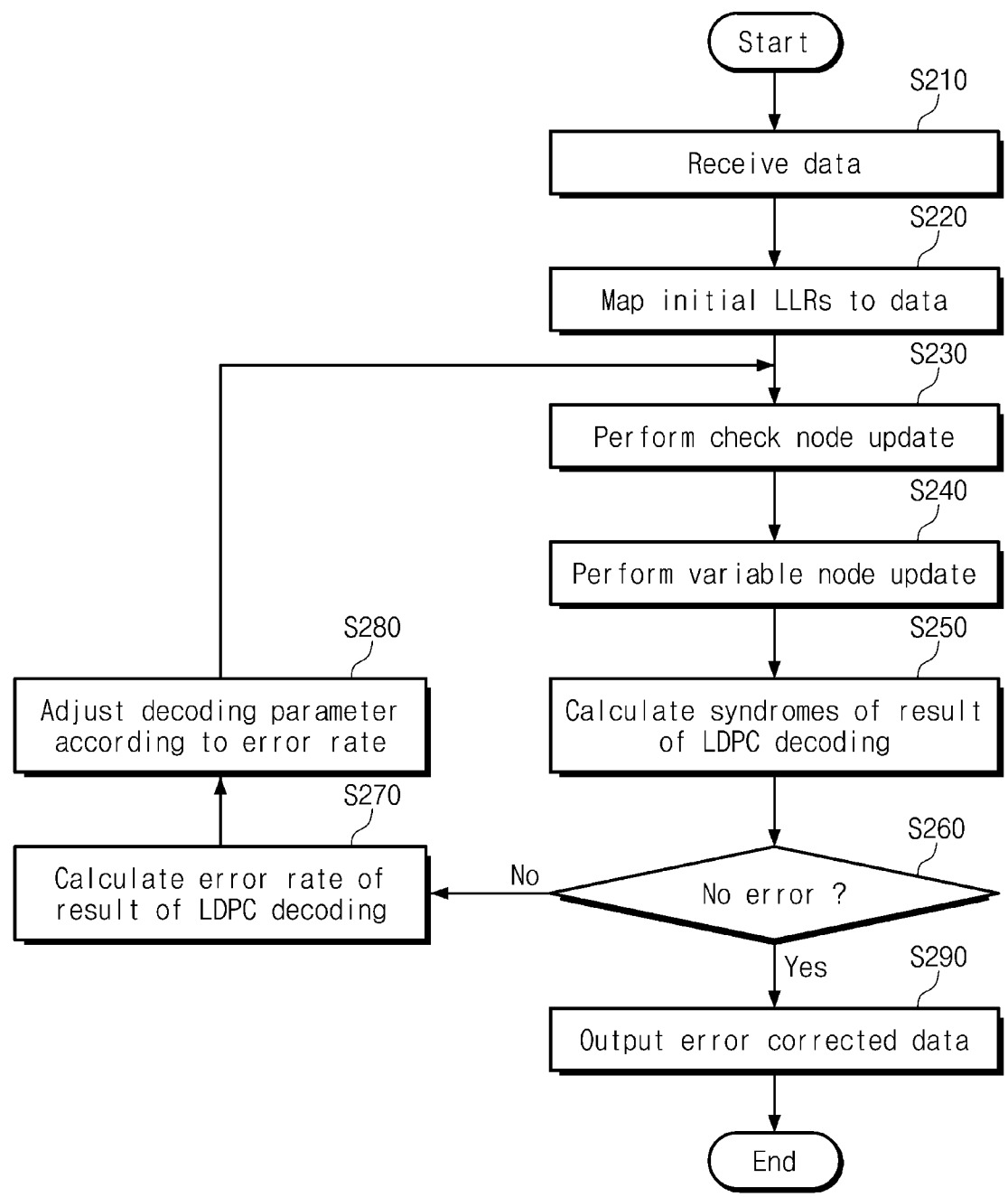
FIG. 4 is a flowchart illustrating an operation method of the error correction device of FIG. 3.
Figure 5:
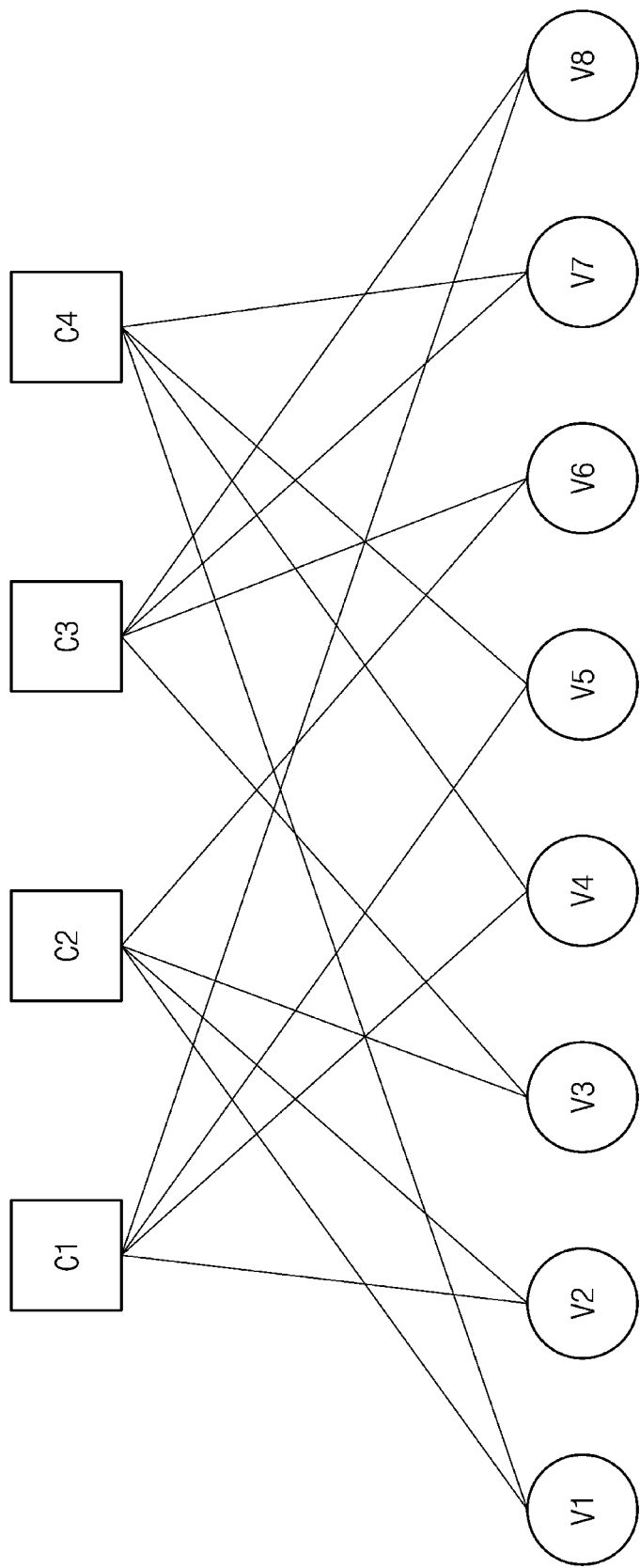
FIG. 5 shows an example of variable nodes and check nodes calculated in a low density parity check (LDPC) decoder.

FIG. 4 is a flowchart illustrating an operation method of the error correction device 100 of FIG. 3. FIG. 5 shows an example of variable nodes V1 to V8 and check nodes C1 to C4 calculated in the LDPC decoder 120.

Referring to FIGS. 3 to 5, in operation S210, the LDPC decoder 120 may receive data "DATA". The data "DATA" may be stored in the data buffer 122. In operation S220, the initial mapper 126 of the LDPC decoder 120 may map initial LLR values to the data "DATA".

For example, the initial mapper 126 may receive the initial LLR values from the memory 110 and may map one of the initial LLR values to each bit, sample, or symbol, based on a value of each bit, sample, or symbol of the data "DATA". The mapping result of the initial LLR values may be stored in the variable node buffer 123. For example, the mapping result of the initial LLR values may be stored as initial values of the variable nodes V1 to V8.

In operation S230, the check node updater 127 of the LDPC decoder 120 may update values of the check nodes C1 to C4. For example, the check node updater 127 may update the values of the check nodes C1 to C4 by using the Min method of the Min-Sum method. The check node updater 127 may update the values of the check nodes C1 to C4 by using the following equation 1.

$$p_{m,n} = \min_{n' \in M(m) \backslash n} |q_{n',m}| \cdot \prod_{n' \in <M(m) \backslash n} \text{sign}(q_{n',m}) \quad \text{[Equation 1]}$$

In Equation 1, "$p_{m,n}$" indicates a message, which indicates that a value of an m-th check node ("m" being a positive integer) is updated and which the m-th check node transmits to an n-th variable node ("n" being a positive integer). M(m) indicates variable nodes connected with the m-th check node. For example, when "m" is 2, variable nodes M(2) connected with the second check node C2 may include first, second, third, and sixth variable nodes V1, V2, V3, and V6.

In Equation 1, "$q_{n',m}$" may be a message that an n'-th variable node transmits to the m-th check node in current LDPC decoding. The n'-th variable node may belong to M(m), thus being a variable node connected with the m-th check node. For example, in the case where LDPC decoding is performed for the first time, "$q_{n',m}$" may be initial values of the variable nodes V1 to V8. In the case where LDPC decoding is performed more than once, "$q_{n',m}$" may be values of the variable nodes V1 to V8 calculated in previous LDPC decoding. In Equation 1, "$\text{sign}(q_{n',m})$" may indicate a sign of the n-th variable node.

According to Equation 1, the m-th check node may have a minimum value of values of remaining variable nodes (e.g., effective variable nodes) other than the n-th variable node, which the m-th check node intends to transmit a message, from among the variable nodes M(m) connected with the m-th check node. Also, the m-th check node may have a sign that is issued as a result of multiplying all signs of effective variable nodes.

For example, when "m" is 2 and "n" is 3, the first, third, and sixth variable nodes V1, V3, and V6 may be effective variable nodes. In operation S240, the variable node updater 128 of the LDPC decoder 120 may update values of the variable nodes V1 to V8. For example, the variable node updater 128 may update the values of the variable nodes V1 to V8 by using the Sum method of the Min-Sum method.

The variable node updater 128 may use a decoding parameter received from the memory 110 upon updating values of the variable nodes V1 to V8. For example, the variable node updater 128 may update the values of the variable nodes V1 to V8 by using the following equation 2.

$$q_{n,m} = \phi_{vc}\left(\sum_{m' \in N(n)\backslash m} \phi_{cv}(p_{m',n}) + \phi_{ch}(C_n)\right) \quad \text{[Equation 2]}$$

In Equation 2, "$q_{n,m}$" indicates a message, which indicates that a value of the n-th variable node is updated and which the n-th variable node transmits to the m-check node. N(n) indicates a check node connected with the n-th variable node. For example, when "n" is 3, check nodes N(3) connected with the third variable node V3 may include second and third check nodes C2 and C3.

In Equation 2, "$p_{m',n}$" may be a message that an m'-th check node transmits to the n-th variable node in current LDPC decoding. The m'-th check node may belong to N(n), thus being a check node connected with the n-th variable node. For example, "$p_{m',n}$" may be values of the check nodes C1 to C4 calculated in current LDPC decoding.

In Equation 2, "$\phi_{cv}$" may be a function having a value that is determined according to a message that the m'-th check node transmits to the n-th variable node. A value of "$\phi_{cv}$" may depend on a decoding parameter transferred from the memory 110 and may be defined as illustrated in the following table 1. In Table 1, for brevity, the input "$p_{m',n}$" is replaced with "x", and the output "$\phi_{cv}$" is replaced with "y".

TABLE 1

| | Input x | | | |
|---|---|---|---|---|
| | 00 | 01 | 10 | 11 |
| Output y | T1 | T2 | −T1 | −T2 |

In Table 1, LLR values T1 and T2 may be transferred from the memory 110 and may vary with an error rate. In an embodiment, the value of "$\phi_{cv}$" is described under assumption that the LDPC decoder 120 is a 2-bit decoder. However, the LDPC decoder 120 is not limited to the 2-bit decoder.

When the LDPC decoder 120 is a k-bit decoder ("k" being a positive integer), the input "x" may be k-bit information. Also, the output "y" may be expressed by "k" values and positive and negative signs. In an embodiment, "$\phi_{cv}$" may assign an LLR value (e.g., a log likelihood ratio) to a message transferred from the m'-th check node.

In Equation 2, "$\phi_{ch}$" may be a function having a value that is determined by a bit $C_n$, sample, or symbol associated with the n-th variable node among the data "DATA". A value of "$\phi_{ch}$" may depend on a decoding parameter transferred from the memory 110 and may be defined as illustrated in the following table 2. In Table 2, for brevity, the input "$C_n$" is replaced with "x", and the output "$\phi_{ch}$" is replaced with "y".

TABLE 2

| | Input x | |
|---|---|---|
| | 0 | 1 |
| Output y | Cth | −Cth |

In Table 2, a code value Cth may be transferred from the memory 110 and may vary with an error rate. In Equation 2, a value of "$\phi_{vc}$" may depend on a decoding parameter transferred from the memory 110 and may be defined as illustrated in the following table 3. In table 3, for brevity, the input is expressed with "x", and the output "$\phi_{vc}$" is replaced with "y".

TABLE 3

| | Input x | | | |
|---|---|---|---|---|
| | x < −Lth | −Lth ≤ x < 0 | 0 ≤ x < Lth | Lth < x |
| Output y | 11 | 10 | 00 | 01 |

In Table 3, a range value Lth may be transferred from the memory 110 and may vary with an error rate. In an embodiment, the value of "$\phi_{vc}$" is described under assumption that the LDPC decoder 120 is a 2-bit decoder. However, the LDPC decoder 120 is not limited to the 2-bit decoder.

When the LDPC decoder 120 is a k-bit decoder, the input "x" may be divided into 2^k intervals. Also, the output "y" may be expressed by "k" bits. In an embodiment, "$\phi_{vc}$" may be an intermediate result calculated by current LDPC decoding. A value of "$\phi_{vc}$" may indicate how much a value of each variable node is close to "1" or is close to "0".

According to Equation 2, a value or message of the n-th variable node may be determined according to values of the remaining check nodes (e.g., effective check nodes) other than the m-th check node, to which the n-th variable node intends to transmit, from among the check nodes N(n) connected with the n-th variable node.

For example, when "n" is 3 and "m" is 2, the third check node C3 may be an effective check node. For example, the value or message of the n-th variable node may be determined by a sum of values of effective check nodes and a sum of values to which the bit Cn, sample, or symbol of the data "DATA" associated with the n-th variable node is applied.

In operation S250, the adaptive decoding controller 130 may calculate syndromes of the LDPC decoding result. For example, the quantizer 131 may quantize values of variable nodes stored in the variable node buffer 123. For example, if a value of a particular variable node is smaller than "0", the quantizer 131 may quantize the value of the particular variable node to "0". If a value of a particular variable node is not smaller than "0", the quantizer 131 may quantize the value of the particular variable node to "1".

For example, as illustrated in Table 3, if a digital value of a particular variable node is "11" or "10", the quantizer 131 may quantize the value of the particular variable node to "0". If a digital value of a particular variable node is "00" or "01", the quantizer 131 may quantize the value of the particular variable node to "1".

In an embodiment, when the data "DATA" are composed of symbols or samples including two or more bits, the quantizer 131 may quantize a value of a variable node to symbols or samples including two or more bits. The number of bits of each variable node quantized by the quantizer 131 is not limited.

Bits, samples, or symbols quantized by the quantizer 131 may be the result of performing LDPC decoding, for example, the result of performing LDPC decoding once. The LDPC decoding result may be transferred to the syndrome calculator 132, for example, as an intermediate decoding result of the whole error correction operation of the error correction device 100.

The syndrome calculator 132 may calculate syndromes from the LDPC decoding result. For example, the syndrome calculator 132 may compute (e.g., multiply) the LDPC decoding result and a parity check matrix. The computation result may be expressed by a set of bits having one value of "0" and "1".

For example, the number of bits of the computation result may be the number of all syndromes. The number of bits of the computation result may be the maximum number of error bits that the error correction device 100 is able to correct. A bit, which has a value of "1", from among the bits of the computation result indicates that an error exists. The number of bits, which have a value of "1", from among the bits of the computation result indicates the number of bits present in the LDPC decoding result.

In operation S260, the adaptive decoding controller 130 may determine whether an error is present in the LDPC decoding result. In an embodiment, if the bits of the computation result do not have a value of "1", the LDPC decoding result may not have an error. If at least one of the bits of the computation result has a value of "0", the LDPC decoding result may have at least one error.

If an error does not exist, in operation S290, the adaptive decoding controller 130 may output the LDPC decoding result quantized by the quantizer 131 to the second external device as the error-corrected data DATA_C. The adaptive decoding controller 130 may terminate error correction associated with the received data "DATA".

If an error exists, in operation S270, the error rate calculator 133 of the adaptive decoding controller 130 may calculate an error rate of the LDPC decoding result. For example, the syndrome calculator 132 may transfer the bits of the computation result to the error rate calculator 133. The error rate calculator 133 may count the number of bits, which have a value of "1", from among the bits of the computation result, that is, the number of errors. The error rate calculator 133 may calculate an error rate by using the number of errors thus counted.

For example, the error rate calculator 133 may calculate the number of error bits to the total number of bits of the computation result (e.g., the total number of check nodes) as the error rate. For another example, the error rate calculator 133 may calculate the number of error bits to the number of bits, samples, or symbols of the data "DATA" (e.g., the total number of variable nodes) as the error rate.

For another example, the error rate calculator 133 may calculate the error rate by normalizing the number of errors to a particular constant, variable, or function. The error rate calculator 133 may be changed or applied to calculate an error rate by using various methods. The form of the error rate that the error rate calculator 133 calculates is not limited to the above description.

In operation S280, the decoding parameter controller 134 of the adaptive decoding controller 130 may adjust a decoding parameter depending on the error rate. For example, the error rate calculator 133 may transfer the calculated error rate to the decoding parameter controller 134. The adaptive decoding controller 130 may allow the memory 110 to output a different decoding parameter depending on the error rate.

Afterwards, check node update may be performed in operation S230, and variable node update may be performed in operation S240. For example, the check node update and the variable node update may constitute one LDPC decoding. One LDPC decoding may accompany the calculating of the syndromes (S250), the calculating of the error rate (S270), and the adjusting of the decoding parameter (S280).

The error correction device 100 may iteratively perform LDPC decoding until an error is absent from the LDPC decoding result. When LDPC decoding is iterated, the error correction device 100 may adjust a decoding parameter, based on the LDPC decoding result. Since the decoding parameter is adaptively adjusted according to an error rate, the error floor of the error correction device 100 may decrease.

FIG. 6 illustrates an example of decoding parameters mentioned in Table 1 to Table 3. Referring to FIG. 6, each of the first to third decoding parameters 111 to 113 may have the range value Lth, the code value Cth, and the LLR values T1 and T2. The first to third decoding parameters 111 to 113 may have different range values Lth, different code values Cth, and different LLR values T1 and T2.

In an embodiment, the first decoding parameter 111 may have the range value Lth of "3", the code value Cth "3", the LLR value T1 of "1", and the LLR value T2 of "3". The second decoding parameter 112 may have the range value Lth of "2", the code value Cth "2", the LLR value T1 of "1", and the LLR value T2 of "3". The third decoding parameter 113 may have the range value Lth of "2", the code value Cth "1", the LLR value T1 of "1", and the LLR value T2 of "3".

For example, when an error rate belongs to a first range, the first decoding parameter 111 may be selected. When an error rate belongs to a second range lower than the first range, the second decoding parameter 112 may be selected. When an error rate belongs to a third range lower than the second range, the third decoding parameter 113 may be selected.

In an embodiment, as an error rate decreases, the range value Lth and the code value Cth may decrease. As an error rate decreases, the LLR values T1 and T2 may decrease, may increase, or may be maintained.

Figure 7:
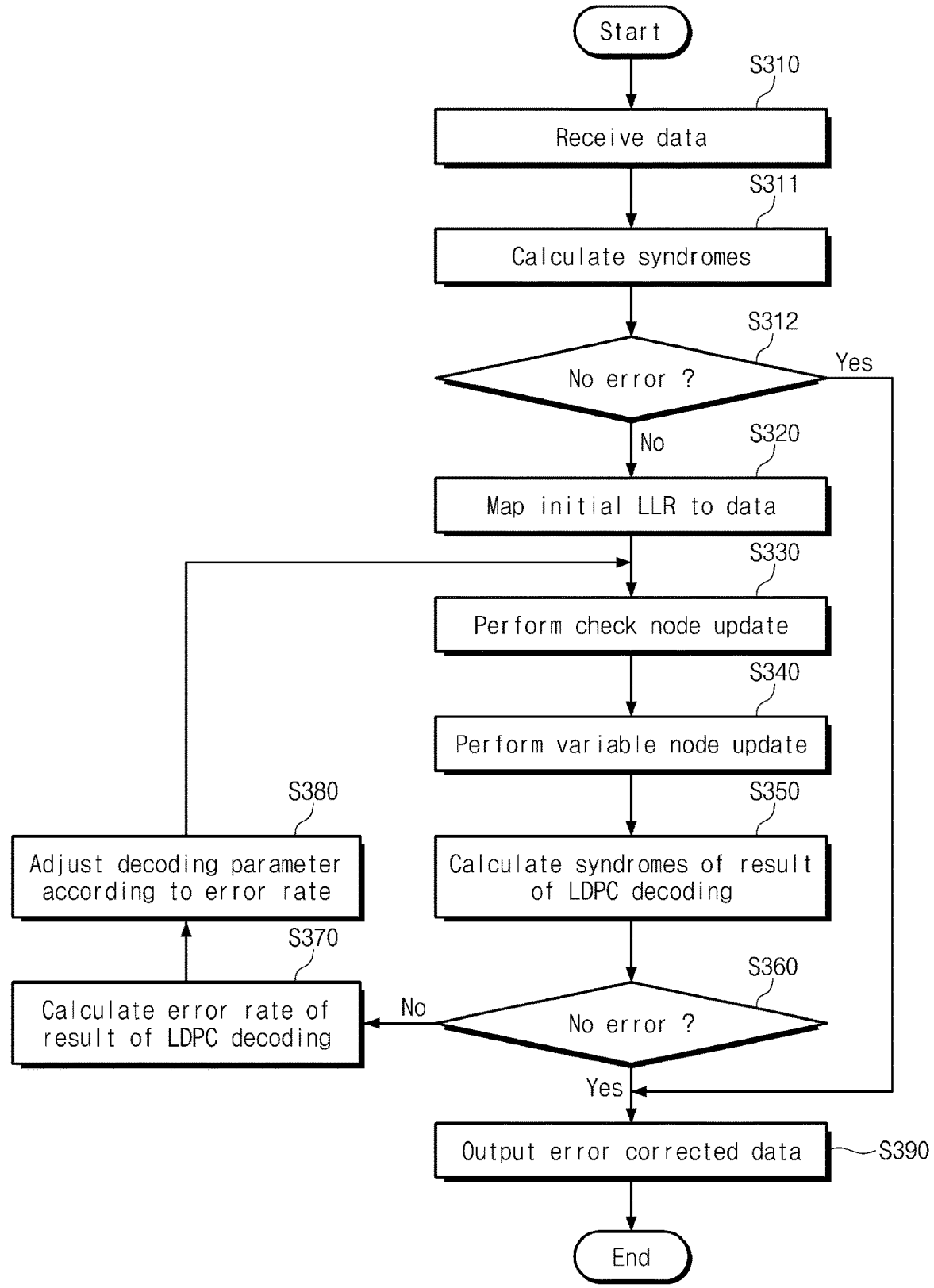
FIG. 7 is a flowchart illustrating an application of an operation method of the error correction device of FIG. 3.

FIG. 7 is a flowchart illustrating an application of an operation method of the error correction device 100 of FIG. 3. Referring to FIGS. 3 and 7, in operation S310, data "DATA" may be received by the data buffer 122 of the LDPC decoder 120. Operation S310 may be identical to operation S210 of FIG. 4.

In operation S311, the adaptive decoding controller 130 may calculate syndromes of the received data "DATA". For example, the syndrome calculator 132 of the adaptive decoding controller 130 may compute the data "DATA" stored in the data buffer 122 and a parity check matrix. If all bits of the computation result are "0", an error may be absent from the data "DATA". If at least one of the bits of the computation result has a value of "1", an error may be present in the data "DATA".

If it is determined in operation S312 that an error is absent from the data "DATA", operation S390 is performed. In operation S390, the adaptive decoding controller 130 may output the data "DATA" stored in the data buffer 122 as error-corrected data DATA_C. The error correction device 100 may complete error correction associated with the received data "DATA".

If it is determined in operation S312 that an error is present in the data "DATA", operation S320 is performed. Operation S320 to operation S380 are substantially identical to operation S220 to operation S280 of FIG. 2, and thus, the description thereof will not be repeated here.

To sum up, before performing LDPC decoding on the received data "DATA", the error correction device 100 may determine whether an error is present in the data "DATA". If an error is absent from the data "DATA", the data "DATA" may be output as the error-corrected data DATA_C without LDPC decoding.

Figure 8:
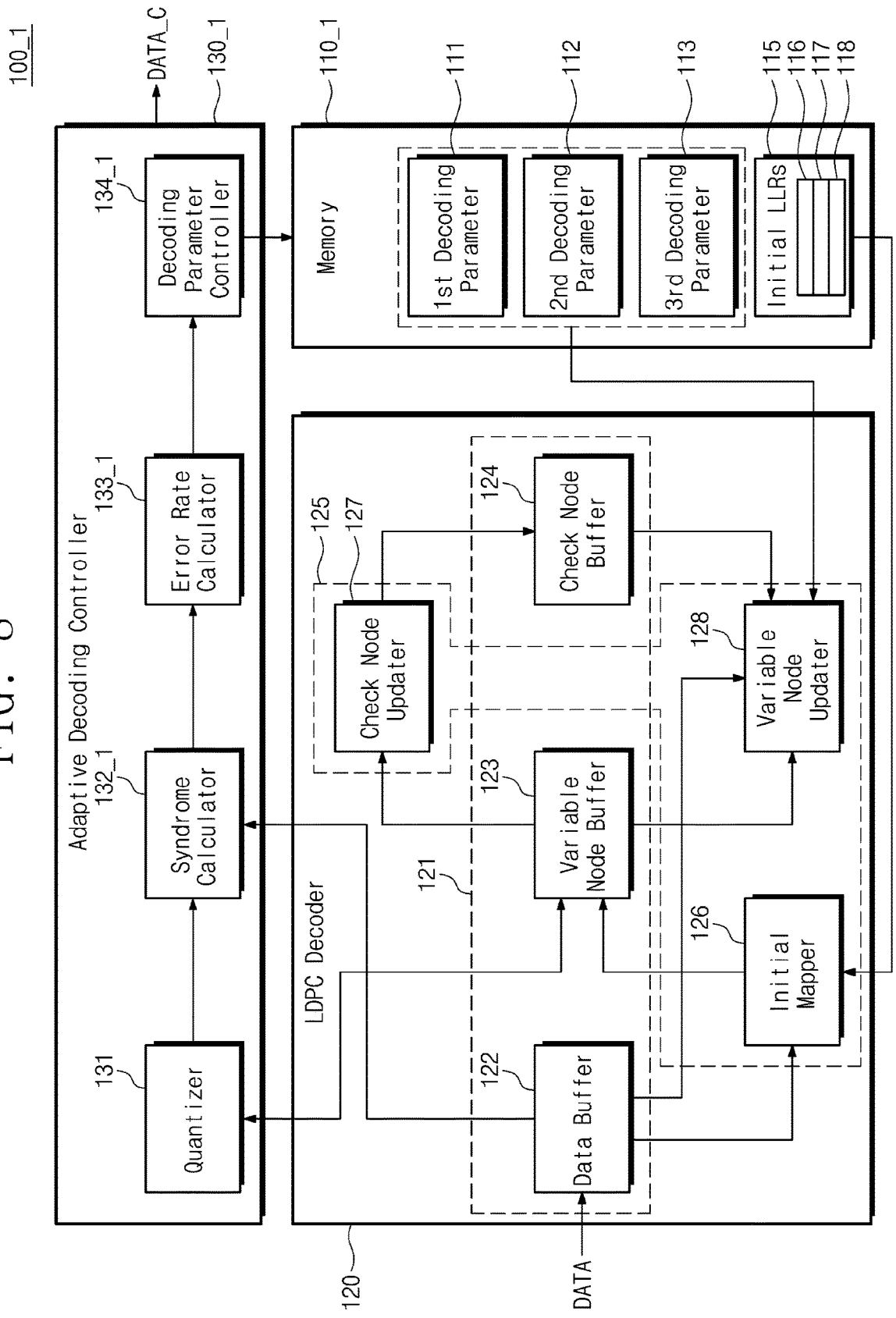
FIG. 8 illustrates an application of the error correction device of FIG. 3.

In an embodiment, a signal path through which the data buffer 122 transfers the data "DATA" to the syndrome calculator 132 may be added to FIG. 3 (refer to FIG. 8). For another example, a separate syndrome calculator that calculates syndromes with respect to data "DATA" stored or to be stored in the data buffer 122 may be added to the adaptive decoding controller 130 or the LDPC decoder 120 of FIG. 3.

FIG. 8 is a block diagram illustrating an application of the error correction device 100 of FIG. 3. Referring to FIG. 8, an error correction device 100_1 includes a memory 110_1, the LDPC decoder 120, and an adaptive decoding controller 130_1. The structure and operating method of the LDPC decoder 120 are identical to those described with reference to FIG. 3, and thus, a description thereof will not be repeated here.

The memory 110_1 may store the first to third decoding parameters 111 to 113 and the LLR values 115. Compared with the memory 110 of FIG. 3, the memory 110_1 may store first LLR values 116, second LLR values 117, and third LLR values 118 as the initial LLR values 115.

The adaptive decoding controller 130 includes the quantizer 131, a syndrome calculator 132_1, an error rate calculator 133_1, and a decoding parameter controller 134_1. The operation of the quantizer 131 is identical to that of the quantizer 131 of FIG. 3, and thus, a description thereof will not be repeated here.

The syndrome calculator 132_1 may perform the same operation as the syndrome calculator 132 described with reference to FIG. 3. In addition to the operation of the syndrome calculator 132, the syndrome calculator 132_1 may calculate syndromes of data "DATA" stored in the data buffer 122. For example, the syndrome calculator 132_1 may compute the data "DATA" stored in the data buffer 122 and a parity check matrix.

The error rate calculator 133_1 may perform the same operation as the error rate calculator 133 described with reference to FIG. 3. In addition to the operation of the error rate calculator 133, the error rate calculator 133_1 may calculate an error rate of the data "DATA" stored in the data buffer 122.

The decoding parameter controller 134_1 may perform the same operation as the decoding parameter controller 134 described with reference to FIG. 3. In addition to the operation of the decoding parameter controller 134, the decoding parameter controller 134_1 may allow the memory 110_1 to output one of the first to third LLR values 116 to 118 depending on the error rate of the data "DATA".

Figure 9:
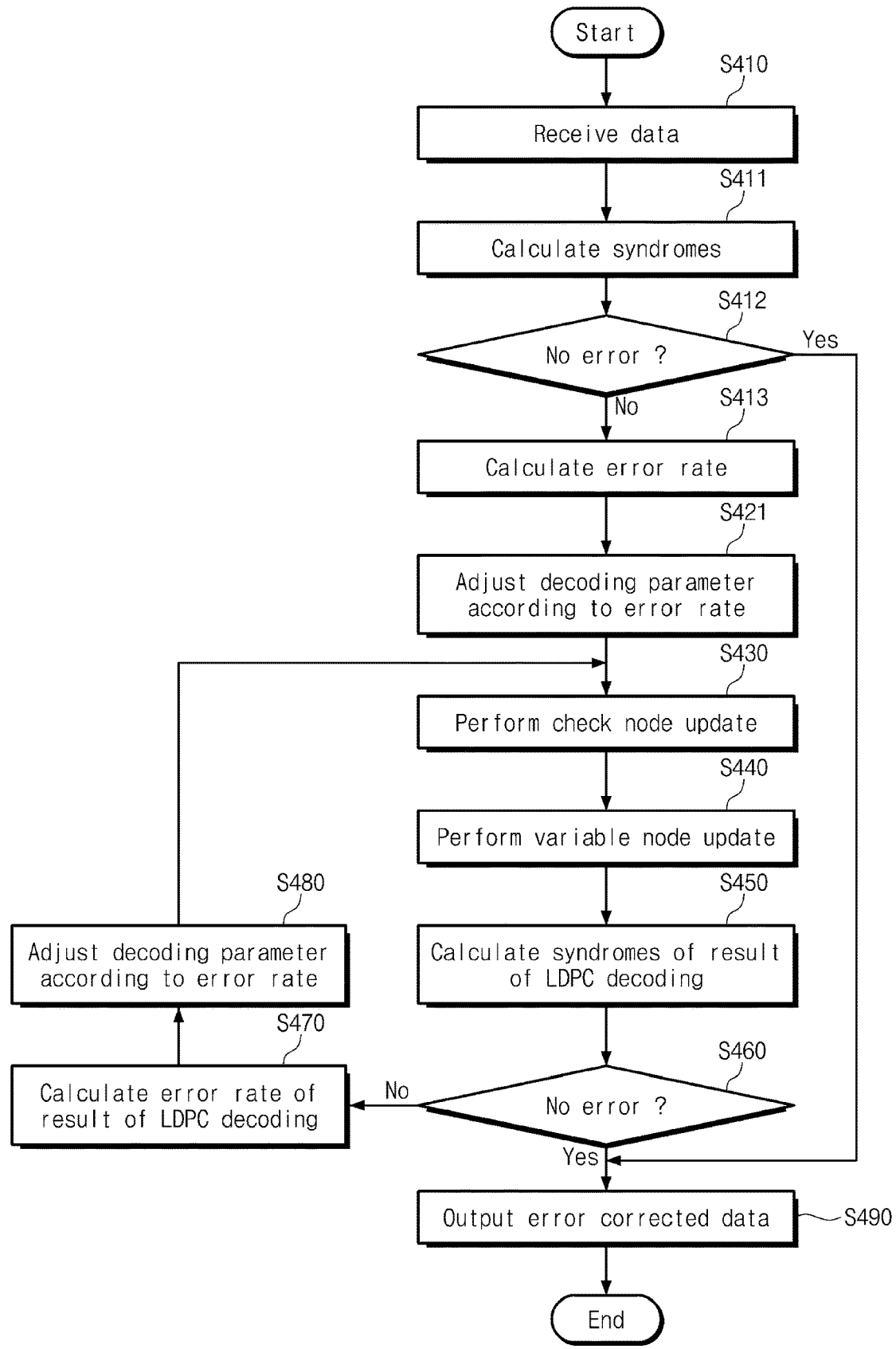
FIG. 9 is a flowchart illustrating an example of an operation method of the error correction device of FIG. 8.

FIG. 9 is a flowchart illustrating an example of an operation method of the error correction device 100_1 of FIG. 8. Referring to FIGS. 8 and 9, in operation S410, data "DATA" may be received by the data buffer 122. In operation S411, the syndrome calculator 132_1 may calculate syndromes of the data "DATA". Operation S410 and operation S411 may be identical to operation S310 and operation S311.

If it is determined in operation S412 that an error is absent from the data "DATA", operation S490 is performed. In operation S490, the adaptive decoding controller 130_1 may output the data "DATA" as error-corrected data DATA_C to the second external device. If it is determined in operation S412 that an error is present in the data "DATA", operation S413 is performed.

In operation S413, the error rate calculator 133_1 may calculate an error rate (e.g., an initial error rate) of the data "DATA". In operation S421, the decoding parameter controller 134_1 may adjust a decoding parameter, based on the error rate. For example, the decoding parameter controller 134_1 may allow the memory 110_1 to output one of the first to third LLR values 116 to 118 depending on the error rate.

Afterwards, operation S430 to operation S480 may be performed to be identical to operation S230 to operation S280, and thus, a description thereof will not be repeated here. As described with reference to FIGS. 8 and 9, the error correction device 100_1 may calculate the error rate of the data "DATA" and may adjust a decoding parameter, that is, initial LLR values, based on the error rate of the data "DATA". Accordingly, the error floor of the error correction device 100_1 may further decrease.

FIG. 10 illustrates an application of the first to third decoding parameters 111 to 113 of FIG. 6. Referring to FIG. 10, each of the first to third decoding parameters 111 to 113 may further include an iteration threshold Ith compared with FIG. 6. The iteration threshold Ith may indicate the number of LDPC decoding iterations to be iteratively performed by using a current decoding parameter. For example, the first to third decoding parameters 111 to 113 may have iteration thresholds Ith of "3", "2", and "1".

Figure 11:
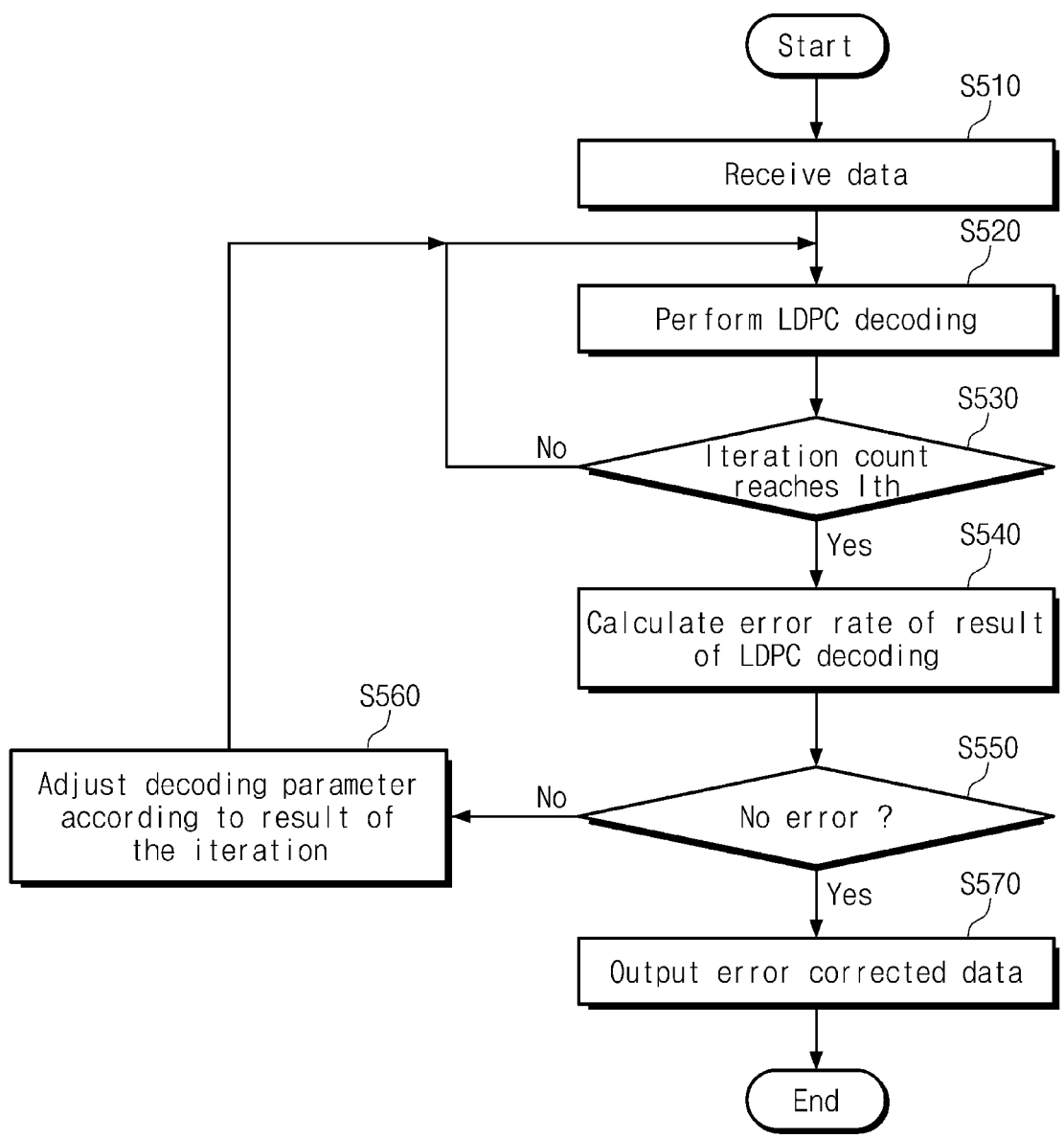
FIG. 11 is a flowchart illustrating an example of performing LDPC decoding based on an iteration threshold of FIG. 10.

FIG. 11 is a flowchart illustrating an example of performing LDPC decoding based on an iteration threshold Ith of FIG. 10. Referring to FIGS. 1 and 11, in operation S510, data "DATA" may be received by the data buffer 122. In operation S520, the LDPC decoder 120 may perform LDPC decoding. LDPC decoding may include check node update and variable node update.

In operation S530, the adaptive decoding controller 130 may determine whether an iteration count reaches the iteration threshold Ith. The iteration count may indicate the number of times that LDPC decoding is performed after a decoding parameter is selected (or adjusted). The iteration count may increase when LDPC decoding is performed. The iteration count may be reset when a decoding parameter is selected (or adjusted).

If it is determined that the iteration count does not reach the iteration threshold Ith, the adaptive decoding controller 130 may omit quantizing, calculating syndromes, determining an error rate, and adjusting (or selecting) a decoding parameter. The decoding parameter may be maintained without modification, the LDPC decoder 120 may perform LDPC decoding from operation S520.

If the iteration count reaches the iteration threshold Ith, operation S540 is performed. Operation S540 to operation S560 may be performed to be identical to operation S130 to operation S150 of FIG. 2, and thus, a description thereof will not be repeated here.

As described above, the error correction device 100 may further adjust an iteration threshold, based on the error rate. For example, when the error rate is high, the error correction device 100 may omit quantizing, calculating syndromes, determining an error rate, and adjusting (or selecting) a decoding parameter and may perform LDPC decoding as much as the iteration threshold Ith.

If quantizing, calculating syndromes, determining an error rate, and adjusting (or selecting) a decoding parameter are omitted, power consumption and latency of the error correction device 100 may decrease. In an embodiment, as an error rate decreases, the adaptive decoding controller 130 may make the iteration threshold Ith small.

In an embodiment, as described with reference to FIG. 4, the error correction device 100 may use the iteration threshold Ith as a decoding parameter. In this case, the error correction device 100 may calculate syndromes and may then determine whether an error exists. If an error exists, the error correction device 100 may calculate an error rate. In an embodiment, as described with reference to FIG. 7, the error correction device 100 may use the iteration threshold Ith as a decoding parameter. In this case, the error correction device 100 may calculate syndromes of data "DATA" before performing LDPC decoding.

In an embodiment, as described with reference to FIG. 9, the error correction device 100 may use the iteration threshold Ith as a decoding parameter. In this case, the error correction device 100 may differently set initial LLR values, based on an error rate of the data "DATA".

Figure 12:
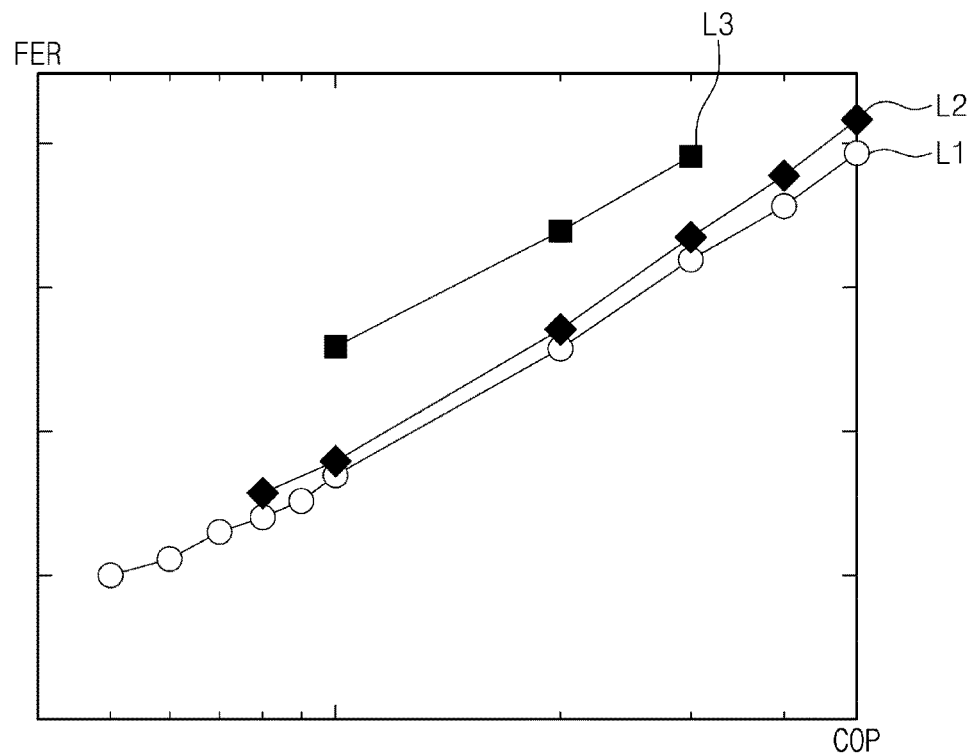
FIG. 12 is a graph showing a result of testing performance of an error correction device according to an embodiment of the disclosure.

FIG. 12 is a graph showing a result of testing performance of the error correction device 100 according to an embodiment of the disclosure. In FIG. 12, a horizontal axis represents cross-over probability (COP) of a binary symmetric channel, and a vertical axis represents a frame error rate (FER).

A first line L1 shows an error rate (e.g., an error floor) of an error correction device according to a Sum-Product algorithm. A second line L2 shows an error rate (e.g., an error floor) of the error correction device 100 according to an embodiment of the disclosure. A third line L3 shows an error rate (e.g., an error floor) of an error correction device according to a Min-Sum algorithm.

Figure 13:
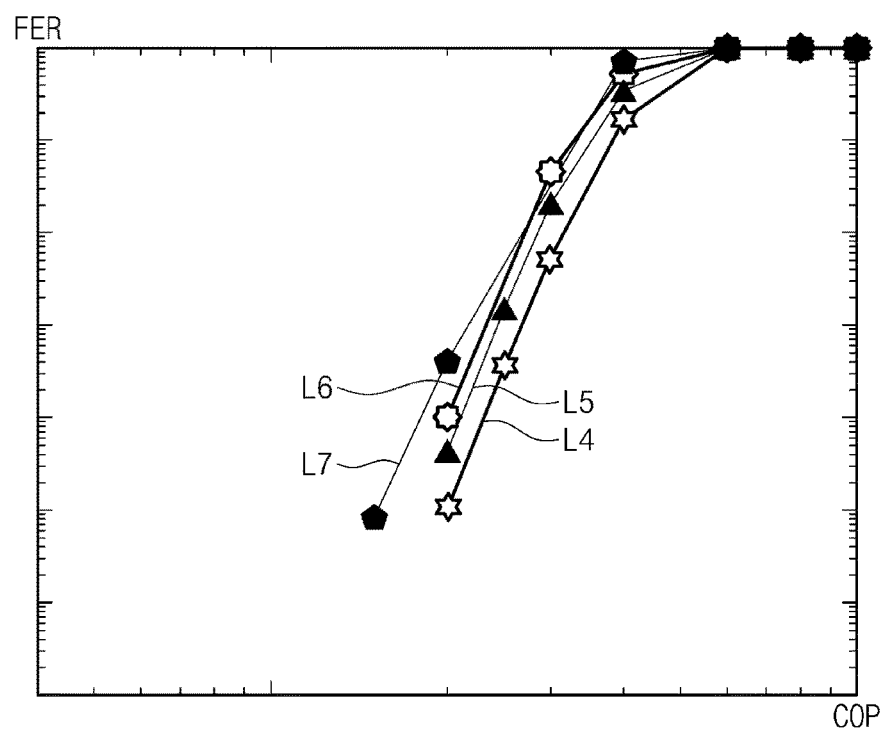
FIG. 13 is a graph showing another result of testing performance of an error correction device according to an embodiment of the disclosure.

FIG. 13 is a graph showing another result of testing performance of the error correction device 100 according to an embodiment of the disclosure. In FIG. 13, a horizontal axis represents cross-over probability (COP) of a binary symmetric channel, and a vertical axis represents a frame error rate (FER).

A fourth line L4 shows an error rate (e.g., an error floor) of an error correction device according to the Sum-Product algorithm. A fifth line L5 shows an error rate (e.g., an error floor) of the error correction device 100 according to an embodiment of the disclosure. A sixth line L6 shows an error rate (e.g., an error floor) of an error correction device according to an algorithm to which an offset is applied to the Min-Sum algorithm. A seventh line L7 shows an error rate (e.g., an error floor) of an error correction device according to the Min-Sum algorithm.

It is understood from FIGS. 12 and 13 that the error floor of an error correction device according to the Sum-Product algorithm is the lowest. However, the error correction device according to the Sum-Product algorithm has high calculation complexity, thus needing very high costs, for example, a resource, power, a time, and the like for the purpose of applying the error correction device to a product.

The error correction device 100 according to an embodiment of the disclosure may have complexity similar to complexity of an error correction device using the Min-Sum algorithm or the algorithm to which an offset is applied to Min-Sum and may implement a lower error floor than an error floor according to the algorithms. This means that the error correction device 100 having low complexity and low error floor is provided.

Figure 14:
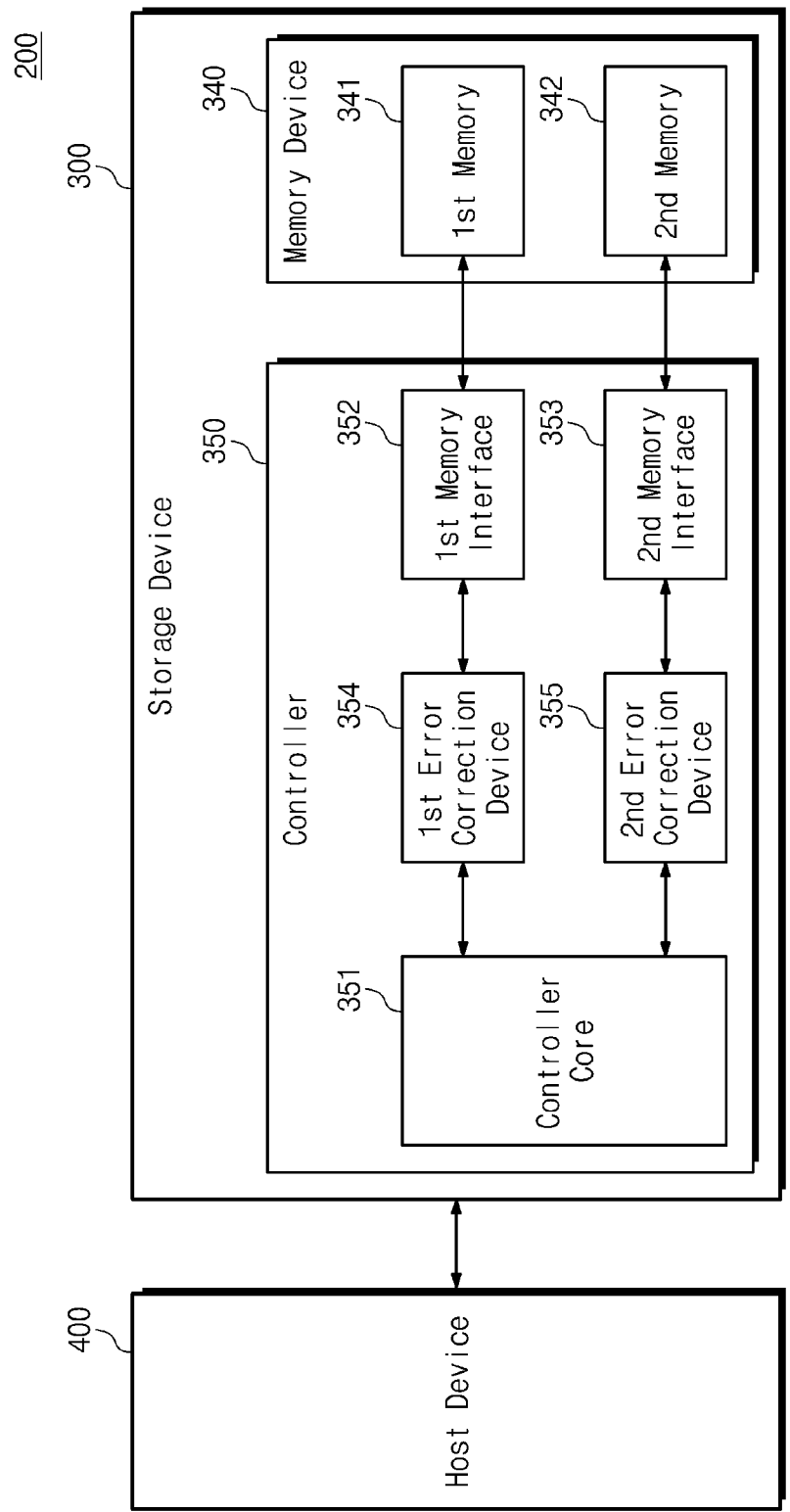
FIG. 14 is a block diagram illustrating a computing device according to an embodiment of the disclosure.

FIG. 14 is a block diagram illustrating a computing device 200 according to an embodiment of the disclosure. Referring to FIG. 14, a computing device 200 may include a storage device 300 and a host device 400. The storage device 300 may store data in response to a request of the host device 400. The storage device 300 may output data to the host device 400 in response to a request of the host device 400.

The host device 400 may store data in the storage device 300 and may read data from the storage device 300. The computing device 200 may be a mobile device such as a smartphone, a smart pad, a smart watch, or the like. The host device 400 may be an application processor.

The storage device 300 may include a memory device 340 and a controller 350. The memory device 340 may include first and second memories 341 and 342. The first and second memories 341 and 342 may be memory dies separated from each other, memory chips separated from each other, or memory packages separated from each other.

The first and second memories 341 and 342 may be homogeneous memories or heterogeneous memories. The first and second memories 341 and 342 may include volatile memories such as a dynamic random access memory (DRAM). The first and second memories 341 and 342 may include nonvolatile memories such as a flash memory, a phase-change memory, a ferroelectric memory, a magnetic memory, or a resistive memory.

Depending on a request of the host device 400, the controller 350 may write data in the memory device 340 or may read data from the memory device 340.

The controller 350 may exchange data to be written in the memory device 340 or data read from the memory device 340 with the host device 400.

The controller 350 includes a controller core 351, first and second memory interfaces 352 and 353, and first and second error correction devices 354 and 355. The controller core 351 may control operations of the storage device 300. The controller core 351 may drive firmware needed to drive the storage device 300.

The controller core 351 may communicate with the host device 400 and may process requests from the host device 400. The controller core 351 may access the memory device 340 depending on the requests from the host device 400. The first and second memory interfaces 352 and 353 may exchange data with the first and second memories 341 and 342 under control of the controller core 351.

The first memory interface 352 may communicate with the first memory 341, and the second memory interface 353 may communicate with the second memory 353. The first and second memory interfaces 352 and 353 may communicate with the first and second memories 341 and 342 in the same manner or in different manners.

The first and second error correction devices 354 and 355 may correct an error of data received from the first and second memory interfaces 352 and 353. For example, the first error correction device 354 may correct an error of data transferred through the first memory interface 352 from the first memory 354.

The second error correction device 355 may correct an error of data transferred through the second memory interface 353 from the second memory 354. The first and second error correction devices 354 and 355 may use the same error correction manner or different error correction manners. The first and second error correction devices 354 and 355 may transfer error-corrected data to the controller core 351.

In an embodiment, each of the first and second error correction devices 354 and 355 may include the error correction device 100 or 110_1 described with reference to FIGS. 1 to 11. That is, at least one of the first and second error correction devices 354 and 355 may iterate LDPC decoding while adjusting a decoding parameter depending on an error rate of LDPC decoding. Accordingly, an error floor of at least one of the first and second error correction devices 354 and 355 may decrease, and the reliability of the storage device 300 and the computing device 200 may be improved.

In the above-described embodiments, components according to embodiments of the disclosure are referred to by using the term "block". The "block "may be implemented with various hardware devices, such as an integrated circuit, an application specific IC (ASCI), a field programmable gate array (FPGA), and a complex programmable logic device (CPLD), software, such as firmware and applications driven in hardware devices, or a combination of a hardware device and software. Also, "block" may include circuits or intellectual property (IP) implemented with semiconductor devices.

According to the disclosure, a decoding parameter is adjusted according to an error rate upon performing a Sum operation of the Min-Sum method. Accordingly, an error correction device having a reduced error floor, an operating method of the error correction device, and a controller including the error correction device are provided.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been described with reference to exemplary embodiments thereof, it will be apparent to those of ordinary skill in the art that various changes and modifications may be made thereto without departing from the spirit and scope of the disclosure as set forth in the following claims.

What is claimed is:

1. An error correction device comprising:
   a low density parity check (LDPC) decoder that includes a parity check matrix and iteratively performs LDPC decoding on data by using the parity check matrix and a decoding parameter; and
   an adaptive decoding controller that calculates an error rate depending on a result of the LDPC decoding and adjusts the decoding parameter, except for the parity check matrix, depending on the error rate, wherein:
   after first LDPC decoding is performed on the data, the adaptive decoding controller adjusts the decoding parameter from a first decoding parameter to a second decoding parameter depending on a result of the first LDPC decoding,
   the LDPC decoder performs second LDPC decoding following the first LDPC decoding on the result of the first LDPC decoding by using the parity check matrix and the second decoding parameter,
   the error correction device further comprises a memory that stores decoding parameters, and
   the adaptive decoding controller controls the memory such that one of the decoding parameters is transferred to the LDPC decoder as the decoding parameter.

2. The error correction device of claim 1, wherein the adaptive decoding controller calculates the error rate, based on values of variable nodes of the result of the LDPC decoding.

3. The error correction device of claim 2, wherein the error rate includes a ratio between a number of incorrect values of the variable nodes and a number of check nodes.

4. The error correction device of claim 1, wherein the adaptive decoding controller adjusts a value to be mapped to each of messages that are transferred from check nodes to variable nodes depending on the error rate.

5. The error correction device of claim 1, wherein the adaptive decoding controller adjusts a value to be mapped to a corresponding bit or corresponding bits of the data at each of variable nodes depending on the error rate.

6. The error correction device of claim 1, wherein the adaptive decoding controller determines a value represented by bits depending on a log likelihood ratio (LLR) value at each variable node and adjusts boundaries of the LLR value, at which the value of the bits is determined, depending on the error rate.

7. The error correction device of claim 1, wherein prior to a first iteration of the LDPC decoding, the LDPC decoder assigns initial LLR values to the data depending on the decoding parameter.

8. The error correction device of claim 7, wherein prior to a first iteration of the LDPC decoding, the adaptive decoding controller calculates an initial error rate of the data and adjusts the initial LLR values depending on the error rate.

9. The error correction device of claim 1, wherein the adaptive decoding controller maintains the decoding parameter for a predetermined number of iterations of the LDPC decoding.

10. The error correction device of claim 9, wherein:
    the decoding parameter further includes the predetermined number of iterations, and
    the adaptive decoding controller adjusts the predetermined number of iterations depending on the error rate.

11. The error correction device of claim 9, wherein the adaptive decoding controller skips calculation of the error rate while the decoding parameter is maintained.

12. An operating method of an error correction device, the method comprising:
    receiving data;
    performing first low density parity check (LDPC) decoding on the data, based on a parity check matrix and a first decoding parameter;
    calculating an error rate depending on a result of the first LDPC decoding;
    adjusting the first decoding parameter, except for the parity check matrix, to a second decoding parameter depending on the error rate; and
    performing second LDPC decoding on a result of the first LDPC decoding, based on the parity check matrix and the second decoding parameter, wherein:
    the error correction device comprises a memory that stores decoding parameters, and
    the adjusting of the first decoding parameter includes controlling the memory such that one of the decoding parameters is selected as the second decoding parameter.

13. The method of claim 12, wherein the calculating of the error rate includes calculating a ratio between a number of incorrect values of variable nodes included in a result of the first LDPC decoding and a number of check nodes.

14. The method of claim 12, further comprising assigning initial log likelihood ratio (LLR) values to bits of the data.

15. The method of claim 14, further comprising:
calculating an initial error rate of the data; and
adjusting the initial LLR values depending on the initial error rate.

16. The method of claim 12, wherein the second LDPC decoding is iterated a predetermined number of iterations while maintaining the second decoding parameter.

17. The method of claim 16, wherein the adjusting of the first decoding parameter to the second decoding parameter depending on the error rate includes adjusting a value of the predetermined number of iterations.

18. A controller comprising:
a memory interface that receives data from a memory; and
an error correction device that corrects an error of the data received through the memory interface, wherein:
the error correction device includes:
  a low density parity check (LDPC) decoder that includes a parity check matrix and iteratively performs LDPC decoding on the data by using a decoding parameter; and
  an adaptive decoding controller that calculates an error rate depending on a result of the LDPC decoding and adjusts the decoding parameter, except for the parity check matrix, depending on the error rate, wherein:
after first LDPC decoding is performed on the data, the adaptive decoding controller adjusts the decoding parameter from a first decoding parameter to a second decoding parameter depending on a result of the first LDPC decoding,
the LDPC decoder performs second LDPC decoding following the first LDPC decoding on the result of the first LDPC decoding by using the parity check matrix and the second decoding parameter,
the error correction device further comprises a memory that stores decoding parameters, and
the adaptive decoding controller controls the memory such that one of the decoding parameters is transferred to the LDPC decoder as the decoding parameter.

* * * * *

UNITED STATES PATENT AND TRADEMARK OFFICE
CERTIFICATE OF CORRECTION

| | | |
|---|---|---|
| PATENT NO. | : 10,868,566 B2 | |
| APPLICATION NO. | : 16/100979 | |
| DATED | : December 15, 2020 | |
| INVENTOR(S) | : Kyeongcheol Yang et al. | |

It is certified that error appears in the above-identified patent and that said Letters Patent is hereby corrected as shown below:

On the Title Page

In Item (73), insert a second assignee – Postech Academy-Industry Foundation, Pohang-si (KR) --, therefor.

Signed and Sealed this
Thirtieth Day of July, 2024

Katherine Kelly Vidal
*Director of the United States Patent and Trademark Office*